United States Patent
Koelling

Patent Number: 5,623,448
Date of Patent: Apr. 22, 1997

[54] APPARATUS AND METHOD FOR IMPLEMENTING INTEGRATED CIRCUIT MEMORY DEVICE COMPONENT REDUNDANCY USING DYNAMIC POWER DISTRIBUTION SWITCHING

[75] Inventor: Jeffrey E. Koelling, Dallas, Tex.

[73] Assignee: Texas Instruments Incorporated, Dallas, Tex.

[21] Appl. No.: 437,602

[22] Filed: May 9, 1995

[51] Int. Cl.$^6$ .................................................. G11C 13/00
[52] U.S. Cl. .............................................. 365/200; 365/210
[58] Field of Search ...................................... 365/200, 210

[56] References Cited

U.S. PATENT DOCUMENTS

| | | | |
|---|---|---|---|
| 5,295,114 | 3/1994 | Kobayashi | 365/200 |
| 5,307,316 | 4/1994 | Takamae | 365/200 |

Primary Examiner—Terrell W. Fears
Attorney, Agent, or Firm—William W. Holloway; Leo N. Heiting; Richard L. Donaldson

[57] ABSTRACT

In order to select between normal memory components and redundant memory components in an integrated circuit memory device, a logic signal (ENABLE/DISABLE) indicative of the requirement to access the normal memory components or to access the redundant memory components is generated in response to an applied address signal group. When the logic signal has a first logic state, power from dynamic power distribution unit (35) is applied to the output stages (32) of the column addressing apparatus (11,32) activating the normal column conducting paths and power is withheld from the output stages (37) which would otherwise activate the redundant column conducting paths. When the logic signal (ENABLE/DISABLE) has a second logic state, power is applied to the output stages 37 activating the redundant column conducting paths and withheld from the output stages 32 which would otherwise activate the normal column conducting paths. By directly controlling the power applied to the output stages (32,37), the logical combination of control signal and other parameter-bearing signals is avoided, thereby resulting in a faster response to the changes in the logic signal.

26 Claims, 5 Drawing Sheets

APPARATUS AND METHOD FOR IMPLEMENTING INTEGRATED CIRCUIT MEMORY DEVICE COMPONENT REDUNDANCY USING DYNAMIC POWER DISTRIBUTION SWITCHING

BACKGROUND OF THE INVENTION

1. Field of the Invention

This invention relates generally to integrated circuit semiconducting devices and, more particularly, to high density semiconductor storage devices. The high density storage devices typically include redundant elements to replace defective elements which would compromise the integrity of the data signals stored therein.

2. Description of the Related Art

As integrated circuit semiconductor devices have become increasing complex while simultaneously including an increasing density of elements, the problem of fabricating a defect-free device has become increasing difficult. Although the probability of each element of a device being marginal or defective is extremely small, the enormous number of elements comprising each device has resulted in device fabrication yields which limit the commercial viability of the fabrication process. In order to increase the yields of the device fabrication process, redundant elements have been included in each device along with apparatus for replacing defective circuit elements with redundant circuit elements. Thus, if during the testing phase, an element is found to be defective, then the electrical paths to the defective element are disabled, and the electrical paths to the equivalent redundant element are enabled. Thereafter, the redundant element provides the functionality that could not be provided by the marginal or defective element.

By way of example, in integrated circuit semiconductor storage devices, the individual storage cells are arranged in a matrix array. The row or x-select apparatus enables a row of memory cells, while the column or y-select apparatus provides the address or access to a specific storage cell associated with the enabled storage cell row. The result of this addressing scheme is that a specific storage cell in the array of storage cells can be accessed in response to a preselected (address) signal group. When a storage cell of a matrix array column is found to be defective, a column of redundant storage cells is substituted for the original group of storage memory cells and a storage cell of the redundant column is accessed when the preselected signal group is applied to the storage device.

Referring to FIG. 1, a block diagram for the accessing of normal columns and for the accessing of redundant columns according to the related art is shown. Normal column address decoding circuit 11 and redundant column address detection circuit 16 have address signal groups identifying the column including the storage cell, which is to be accessed, applied thereto. Signals identifying a particular column generated by the redundant column address detection circuit 16 are applied to the redundant column decoder/driver unit 17. In addition, the redundant column address detection circuit 16 applies an ENABLE/DISABLE signal to the redundant column decoder/driver unit 17 and to the normal column decoder/driver unit 12. The normal column decoder/driver unit 12 applies an activating signal to the normal column conducting path, to which the storage cell being addressed is coupled. The redundant column decoder/driver unit applies signals to the redundant column conducting path activating a redundant column to which is coupled the storage cell identified by the address signals.

The operation of the column address apparatus of FIG. 1 can be understood as follows. In the absence of a defect in the storage cells which can be activated by column address decoding circuit 11 and the normal column decoder/driver unit 12, the ENABLE/DISABLE signal continuously disables redundant column decoder/driver unit 17 and continuously enables the normal column decoder/driver unit 12. Therefore, in the absence of a defective storage cell in the column conducting path to be accessed, the column conducting path to be activated is determined by the column address decoding circuits 11 and the normal column decoder/driver unit 12 in response to the column address signals. When, however, a defect in a storage cell coupled to a normal column conducting path is identified, then a non-defective redundant column conducting path is identified. The redundant column address detection circuits 16 is programmed, by means of a laser-activated fuse elements in the preferred embodiment, to respond to the address signal groups identifying the normal column with the identified address. As a result of the programming, when the column address signals are applied to the column address decoding circuit 11 and to the redundant column address detection circuit 16, the redundant column address detection circuits 16, by means of a change in the ENABLE/DISABLE signal, disables the normal column decoder/driver unit 12 thereby preventing activation of the defective normal column conducting path. The change in the ENABLE/DISABLE signal simultaneously enables the redundant column decoder/driver unit 17 so that the address signals applied to the redundant column address detection circuit 16 result in an activation signal being applied to the (now) enabled redundant column decoder/driver unit 17. As a result, an activation signal is applied to and activates the non-defective redundant column conducting path to which the storage cell to be addressed is coupled. In summary, as a result of programming the redundant column address detection circuit 16, the applied address signal groups activate a redundant column conducting path to which a non-defective storage cell is coupled, rather than activating the normal column conducting path to which a defective storage cell is coupled.

Referring next to FIG. 2, a partial schematic diagram for the redundant and normal column decoder/driver units 17 and 12, respectively, according to the preferred embodiment, is shown. Redundant column address detection circuit 16 applies address-derived signals to input terminals of logic NAND gates 172 through 174, these logic NAND gates being a part of redundant column decoder/driver unit 17. The ENABLE/DISABLE signal is applied to an input terminal of inverting amplifier 171. The output terminal of inverting amplifier 171 is coupled to an input terminal of each of logic NAND gates 172 through 174. The output terminals of logic NAND gates 172 through 174 are coupled to input terminals of inverting amplifiers 175 through 177, respectively. The output terminal of each inverting amplifier 175 through 177 is coupled to a redundant column conducting path. Address-derived signals from normal column address decoding circuit 11 are applied to a series of logic NAND gates 121*a*1 through 121*n*1, each logic NAND gate 121*a*1 through 121*n*1 being included in a normal column decoder/driver subunit 121*a* through 121*n*. Each logic NAND gate 121*a*1 through 121*n*1 has the ENABLE/DISABLE signal applied to an input terminal thereof. The output terminal of logic NAND gates 121*a*1 through 121*n*1 are applied input terminals of inverting amplifiers 121*a*2 through 121n2 respectively. The output signals of the inverting amplifiers 121a2 through 121n2 is applied to a multiplicity of normal column decoder/driver subunits. For example, the output signal from inverting amplifier 121a2 is applied to an input terminal of logic NAND gates 123b1 through 123n1, logic NAND gates 123b1 through 123n1 being included in normal column decoder/driver subunits 123b through 123n respectively. Using subunit 123b as an example, the output signal from logic NAND gate 123b1 is coupled through inverting amplifier 123b2, through inverting amplifier 123b3, and through inverting amplifier 123b4 to a normal column conducting path associated with a predetermined column address signal group. The operation of the apparatus shown in FIG. 2 follows the description for FIG. 1 except that preferred embodiment of the circuit implementation is shown. In the typical embodiment, the normal decoder/driver unit 12 drives 256 column conducting paths by activating, in response to address-derived signals, one of thirty-two output terminals for the normal column decoder/driver subunit 12a. The output terminals of the normal column decoder/driver subunit 12a can activate one of two hundred and fifty-six circuits in subunit 12b. For a given column address, the ENABLE/DISABLE signal determines whether a normal column conducting path is selected or a redundant column conducting path by controlling the operation of the NAND gates 172 through 174 and 121a1 through 121n1. The three series-coupled inverting amplifiers in the subunits of 12B (for example, 123b2, 123b3, and 123b4 provide a buffering to drive the (heavily loaded) columns of storage cells through a relatively small input signal. Furthermore, FIG. 2 suggests that, following the activation of the ENABLE/DISABLE signal, a six gate delay exists in the normal column decoder/driver unit 12, while a three gate delay is present in the redundant column decoder/driver unit 17.

The performance, and therefore the competitiveness, of the memory device should be maintained as the redundant elements are added. However, as indicated above, to avoid an overlap of activated column conducting paths, the activation of a redundant column conducting path following a normal column conducting path activation must be delayed because of the gate delay following the ENABLE/DISABLE signal.

A need has therefore been felt for a technique for disabling the activation of a normal column conducting path and enabling the activation a redundant column conducting path in a semiconducting memory without serious compromise in performance and without a difference in the delay times following the change in state of the ENABLE/DISABLE signal.

SUMMARY OF THE INVENTION

The aforementioned and other features are provided, according to the present invention, by providing apparatus, responsive to the logic state of a control signal, which applies power to a first output stage while withholding power to a second output stage. Upon change of state of the control signal, the apparatus withholds power from the first output stage while applying power to the second output stage. The invention provides for a logic signal selection of device output state without requiring the combination of the logic signal with other parameter-designating logic signals. The apparatus finds application, for example, in the enabling of the redundant column conducting paths for selected addresses in an integrated circuit storage device.

These and other features of the present invention will be understood upon reading of the following description in conjunction with the Figures.

DESCRIPTION OF THE PREFERRED EMBODIMENT(S)

1. Detailed Description of the Drawings

Figure 1:
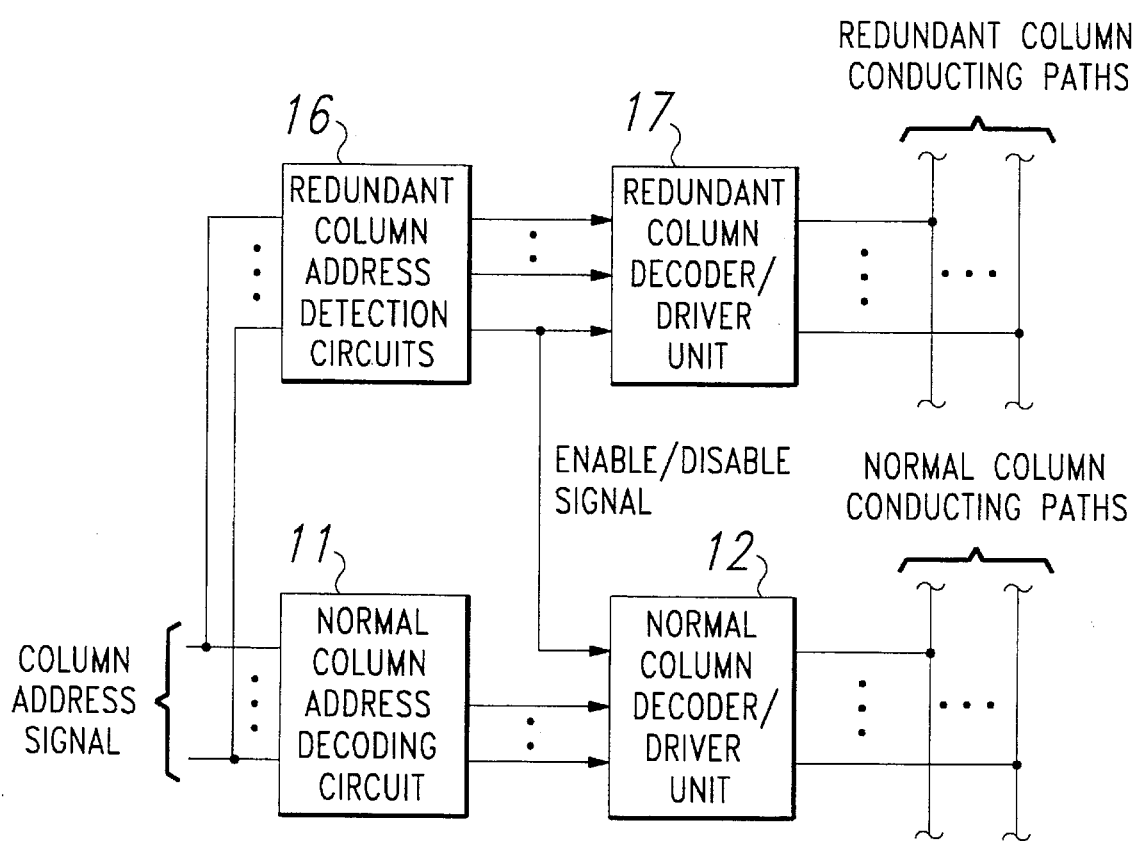
FIG. 1 is a block diagram of the column address apparatus according to the related art.
Figure 2:
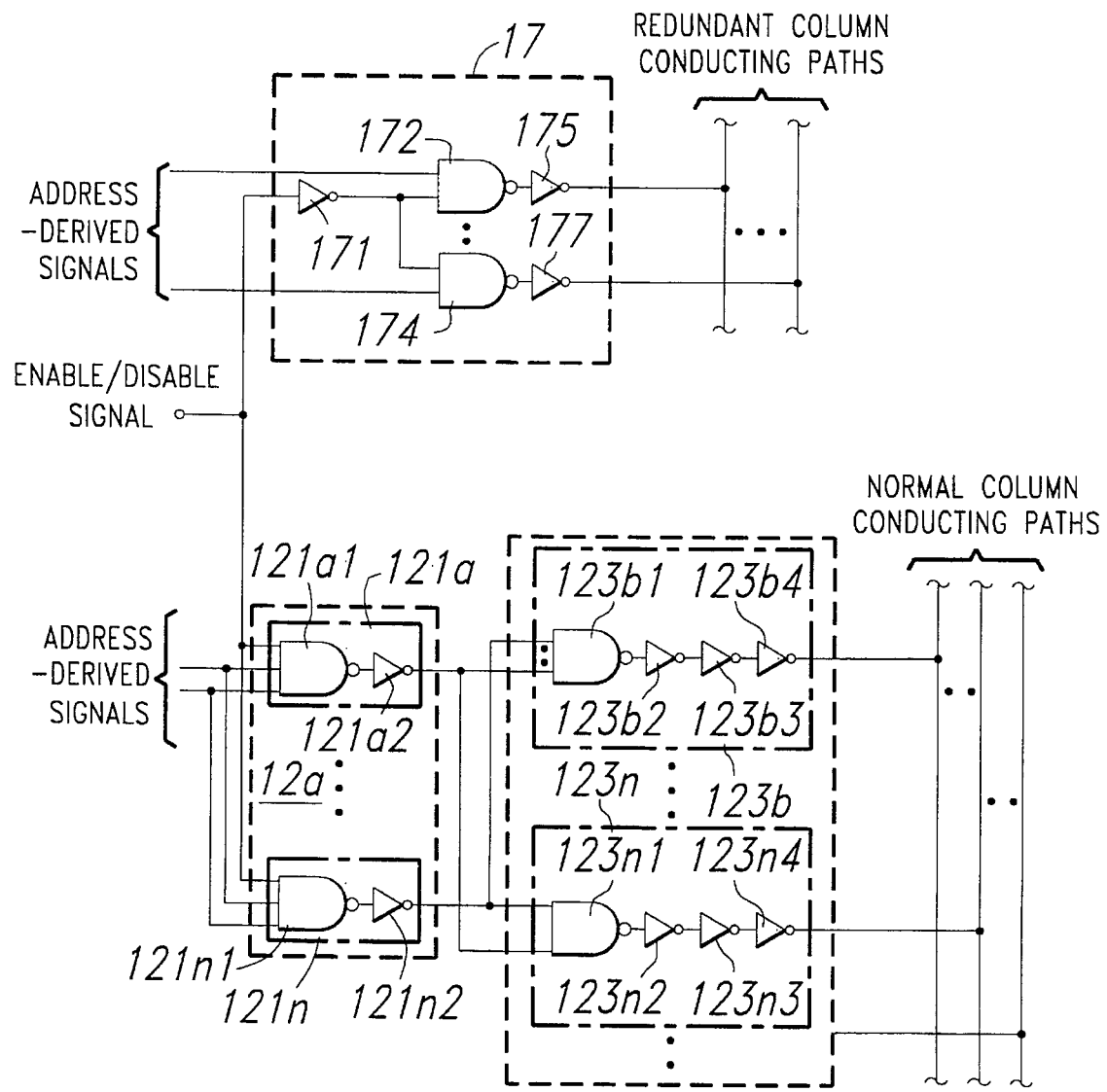
FIG. 2 is partial schematic diagram illustrating portions of the column address apparatus, shown in FIG. 1, in more detail.

FIGS. 1 and 2 have been discussed in relationship to the related art.

Figure 3:
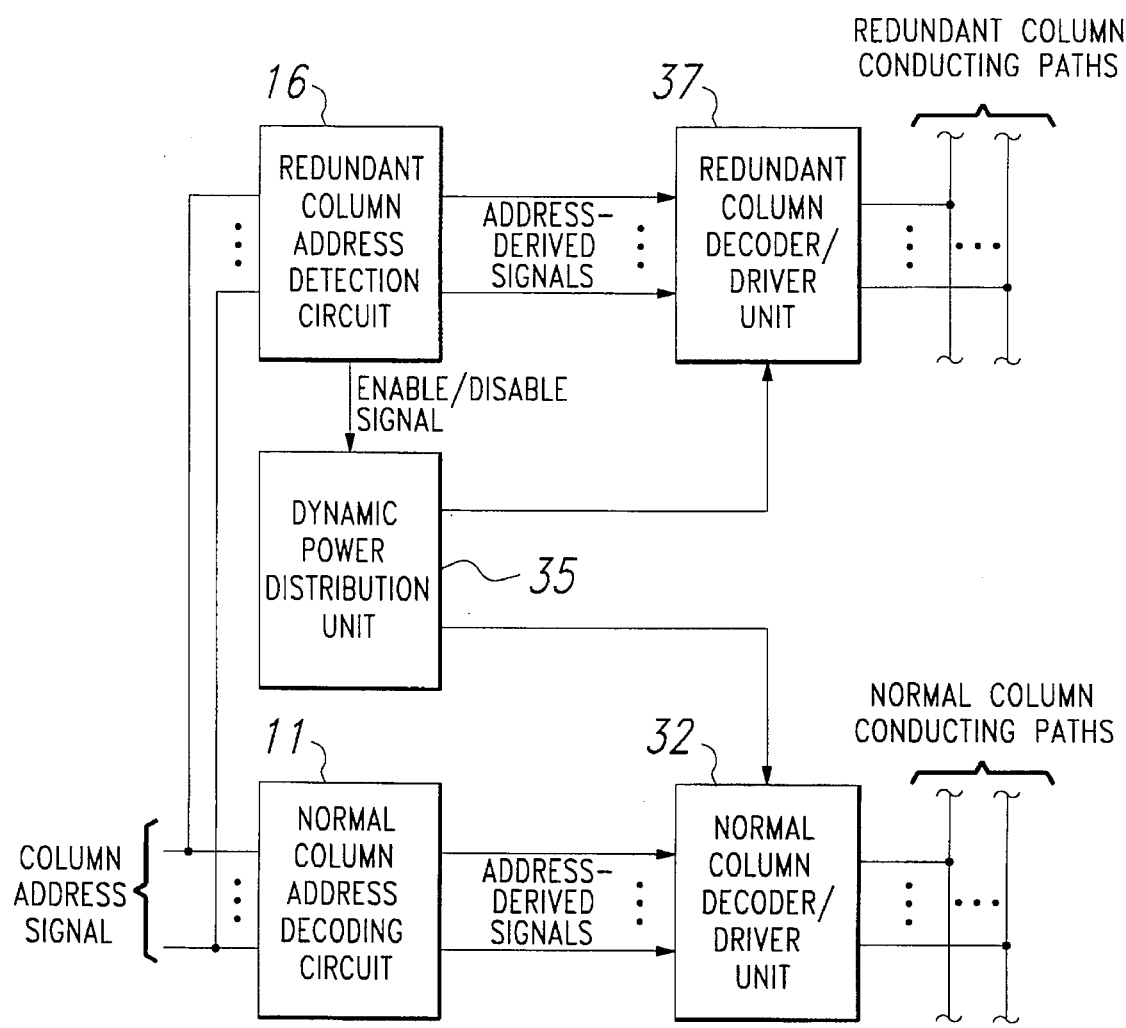
FIG. 3 is a block diagram of the column address apparatus according to the present invention.

Referring now to FIG. 3, a block diagram of the column address apparatus of the present invention is shown. Address signals are applied to normal column address decoding circuit 11 and to redundant column address detection circuit 16. The normal column address decoding circuit 11 apply address-derived signals to normal column decoder/driver unit 32. The redundant column address detection circuit 16 apply address-derived signals to redundant column decoder/driver unit 37 and an ENABLE/DISABLE signal to dynamic power distribution unit 35. The power distribution unit 35 applies signals to the redundant decoder/driver unit 37 and to the normal column decoder/driver unit 32. The redundant column decoder/driver unit 37 applies activation signals to redundant column conducting paths, while the normal column decoder/driver unit 32 applies signals to normal column conducting paths.

Figure 4:
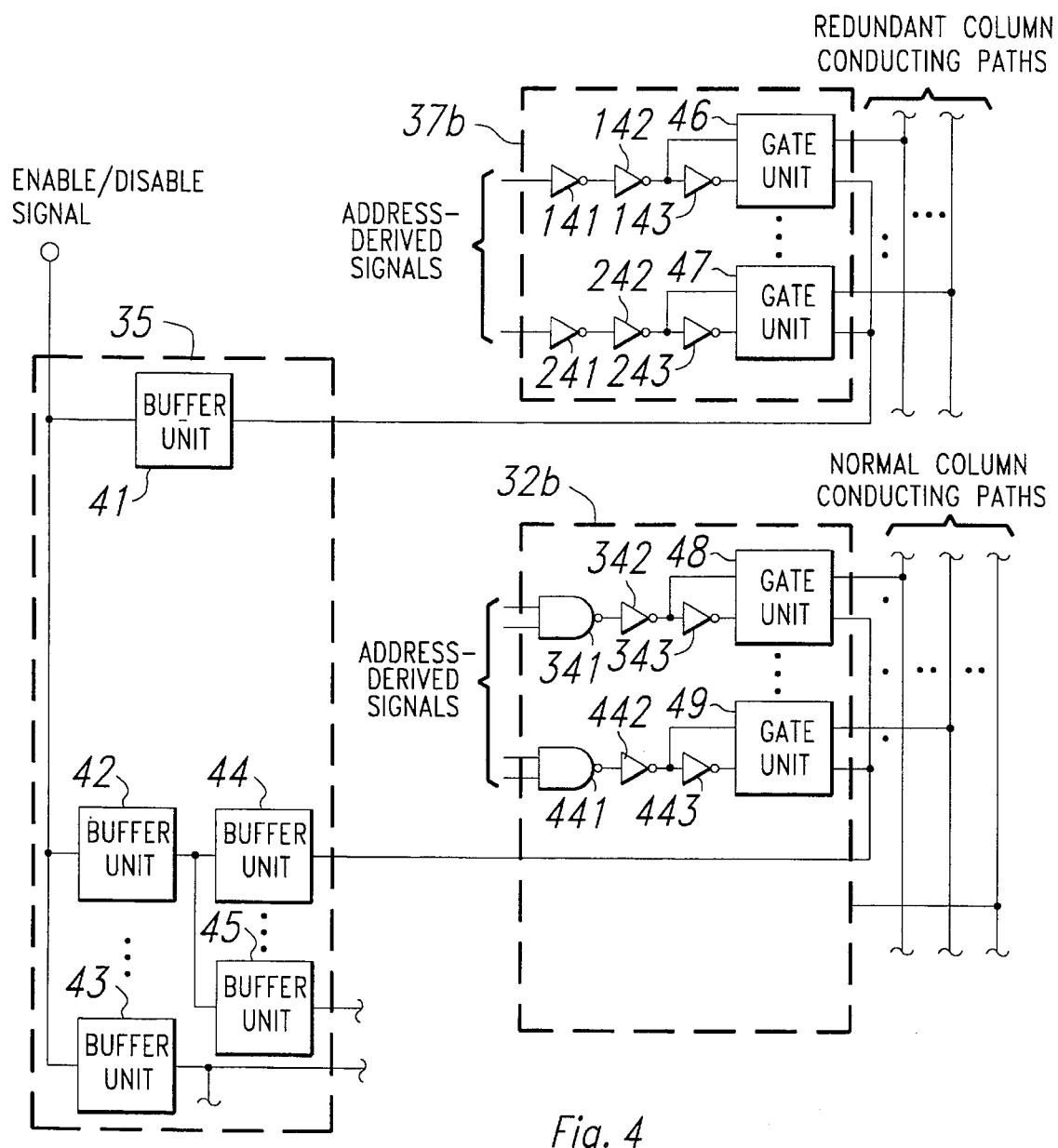
FIG. 4 is a partial schematic diagram of portions of the column address apparatus of the present invention.

Referring to FIG. 4, the implementation of the redundant column decoder/driver subunit 37b and the normal column decoder/driver subunit 32b, according to the present invention, is shown. The derived-address signals from the redundant column address detection subunit 37a (not shown) are applied to inverting amplifiers 141 through 241. The output signals of inverting amplifiers 141 through 241 are applied through inverting amplifiers 142 through 242, respectively, through inverting amplifiers 143 through 243, respectively, and applied to input terminals of gate units 46 through 47, respectively. The input signal to the inverting amplifiers 143 through 243 are applied to the coupling terminals of gate4 units 46 through 47 repectively. The output signals from gate units 46 through 47 are each applied to a redundant column conducting paths. The address-derived signals are applied to the input terminals of the logic NAND gates 341 through 441, these logic NAND gates being included as one of a multiplicity of subunits of the normal column decoder/driver subunit 32b. The output signals of the logic NAND gates 341 through 441 are applied through inverting amplifiers 342 through 442, respectively, then through inverting amplifiers 343 through 443, respectively, and applied to input terminals of gate units 48 through 49, respectively. The input signals to the inverting amplifiers 343 through 443 are applied to the coupling terminals of gate units 48 through 49, respectively. The output terminals of gate units 48 through 49 are each coupled to a normal column conducting path. The ENABLE/DISABLE signal is applied to buffer unit 41 and to buffer units 42 through 43. The output signal of buffer unit 42 is applied to input terminal of buffer units 44 through 45. The output signal from buffer unit 44 is applied to gate units 48 through 49.

Figure 5:
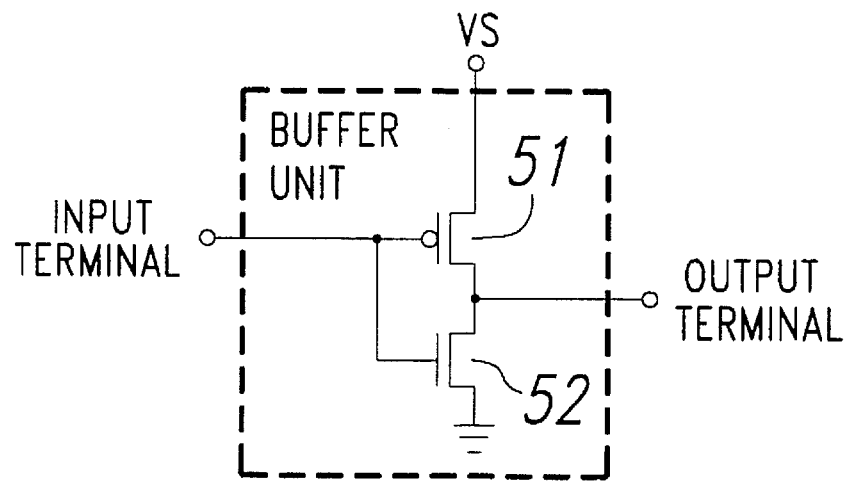
FIG. 5 illustrates an implementation of the buffer units of FIG. 4 according to the preferred embodiments.

Referring to FIG. 5, an implementation of the buffer units shown in FIG. 4, according to the present invention, is illustrated. The input terminal of the buffer unit is coupled to a gate terminal of p-channel transistor 51 and is coupled to a gate terminal of n-channel transistor 52. A source terminal of transistor 51 is coupled to the supply terminal VS, while the drain terminal of transistor 51 is coupled to the output terminal and to a drain terminal of transistor 52. The source terminal of transistor 52 is coupled to a ground terminal.

Figure 6:
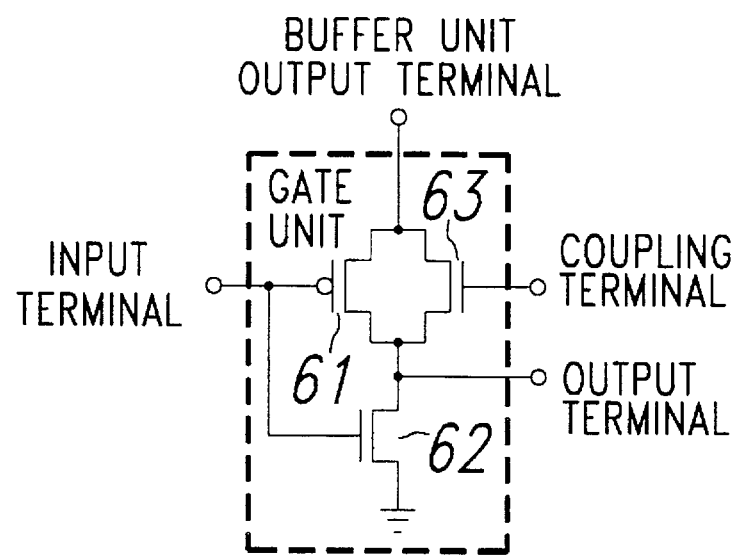
FIG. 6 illustrates and implementation of the gate units of FIG. 4 according to the present invention.

Referring to FIG. 6, an implementation of the gate units shown in FIG. 4 according to the present invention is shown. The input terminal is coupled to a gate terminal of p-channel transistor 61 and coupled to a gate terminal of n-channel transistor 62. The source terminal of transistor 61 is coupled to an output terminal of a buffer unit and to a drain terminal of n-channel transistor 63. The gate terminal of transistor 63 is the gate unit coupling terminal. The source terminal of transistor 63 is coupled to a drain terminal of transistor 61, to an output terminal, and to drain terminal of transistor 62, The source terminal of transistor 62 is coupled to the ground terminal.

2. Operation of the Preferred Embodiment(s)

Referring once again to FIG. 4, the present invention, rather than providing a logic circuit enabling and disabling of the normal and redundant decoder/driver units, provides for a control of the power applied to these components. When the power is applied to the redundant column decoder/driver unit and power is removed from the normal column decoder/driver unit, then the addressed (selected) redundant conducting path is activated. When the normal column decoder/driver unit has power applied and power is not applied to the redundant column decoder/driver unit, then the addressed (selected) normal conducting path will be activated. Referring to FIGS. 4, 5, and 6, when the ENABLE/DISABLE SIGNAL is high, the supply terminals of all of the output stages (i.e., the gate units) of the redundant column decoder/driver unit are connected to ground. As consequence, the redundant column conducting paths are not activated. However, for the high ENABLE/DISABLE signal, the supply terminals of the output stages of the normal column decoder/driver unit are connected to the power supply terminal VS and the addressed (selected) normal column conducting path will be activated. Only the output stages have the controllable power supplied thereto to reduce the loading on the buffer units which control the power switching. As will be seen from FIGS. 4, 5, and 6, only one gate delay with respect to the propagation of the ENABLE/DISABLE signal is present between the activation of the normal and the redundant column conducting paths.

The group of buffer units 42 through 43 provides an initial "fan-out" of the switching signal resulting from the ENABLE/DISABLE signal. The secondary groups of buffer units (i.e., buffer units 44 through 45 coupled to buffer unit 42) continue the signal "fan-out", thereby providing sufficient power to control the operating mode of the output gate units.

While the invention has been described with particular reference to the preferred embodiment, it will be understood by those skilled in the art that changes may be made and equivalents substituted for elements of the preferred embodiment without departing from the invention. For example, the present invention has been described with particular reference to an integrated circuit memory device. However, the techniques herein described can be applicable to any situation wherein one of two signals must be selected. In addition, many modifications may be made to adapt a particular situation and material to a teaching of the present invention without departing from the essential teachings of the present invention.

As will be evident from the foregoing discussion, certain aspects of the invention are not limited to the particular details or examples illustrated, and it is therefore contemplated that other modifications and applications will occur to those skilled in the art. It is accordingly intended that the claims shall cover all modifications and applications as do not depart from the spirit and scope of the invention.

What is claimed is:

1. Apparatus responsive to a control signal for selectively applying activation signals either to a first group of electrical elements or to a second group of electrical elements, said apparatus comprising:

a plurality of first gates each coupled to an electrical element of said first group of electrical elements, each of said first gates transmitting an activation signal to said coupled first element when power is applied thereto;

at least one first buffer unit coupled to said plurality of first gates, said first buffer unit applying power to said plurality of first gates when said control signal has a first state;

at least one second gate, each second gate coupled to a second electrical element, each of said second gates transmitting an activation signal to said coupled second electrical element, each of said second electrical elements related to a first electrical element;

at least said second buffer unit coupled to said second gates, said second buffer unit applying power to said second gate when said control signal has a second logic state; and an identification circuit responsive to a group of signals related to said activation signals, said identification circuit determining when a group of first electrical elements related to a group of second electrical elements are to receive activation signals by controlling a state of said logic signal.

2. The apparatus of claim 1 wherein said identification means changes a state of said control signal when said identification circuit determines that said second group of electrical elements is not to receive activation signals.

3. The apparatus of claim 2 wherein said gate units include two series-coupled transistors, one of said transistors being coupled to a buffer unit.

4. The apparatus of claim 3 wherein said gate unit further includes:

an inverting amplifier having an output terminal coupled to gate terminals of said two series-coupled transistors; and a third transistor coupled in parallel with a one of said series-coupled transistors, wherein said activation signal is applied to an input terminal of said inverting amplifier and to a gate terminal of said third transistor.

5. The apparatus of claim 4 wherein said buffer unit includes two transistors coupled in series, wherein each gate unit receives power from a terminal coupled to said buffer unit transistors.

6. The apparatus of claim 2 wherein activation signals applied to said first group of gate units are generated by a first addressing unit for activating said first group of electrical elements, said first group of electrical elements being normal conducting paths in an integrated circuit storage unit, activation signals applied to said second gate units being generated by a second addressing unit for activating said second group of electrical elements, said second group of electrical elements being redundant conducting paths replacing defective normal conducting paths, wherein said identification means is included in said second addressing means.

7. The apparatus of claim 6 wherein said identification unit applies said control signal to said buffer units, said control signal having said second state when redundant conductor paths are to be activated.

8. Apparatus for applying a signal to a conducting path in response to applied signal sets, said apparatus comprising:

a first decoding circuit responsive to said applied signal set for providing first derived signal sets;

a second decoding circuit responsive to said applied signal sets for providing second derived signal sets, said second decoding circuit responsive to at least one predetermined applied signal set for changing a state of a control signal from a first state to a second state;

a first driver unit having said first derived signal sets applied thereto, said first driver unit applying signals to first conducting paths associated with each applied signal set;

a second driver unit having said second derived signal sets applied thereto, said second driver unit applying signals to second conducting paths associated with each applied signal set; and a power distribution unit coupled to said first and to said second driver units and responsive to said control signal for applying power to said first driver when said control signal is in said first state, said power distribution unit applying power to said second driver unit when said control signal is in said second state.

9. The apparatus of claim 8 wherein said apparatus is addressing apparatus in a semiconductor memory unit, said first conducting paths being coupled to groups of normal storage cells, said second conducting paths being coupled to groups of redundant storage cells.

10. The apparatus of claim 9 wherein said second decoding apparatus is programmed to respond to the same applied signal sets which result in application of signals to conducting paths by said first driver unit.

11. The apparatus of claim 10 wherein application of power by said power distribution unit is to output stages of said first and said second driver units.

12. The apparatus of claim 11 wherein a conducting path receiving a signal from said second driver unit replaces a conducting path activated by said first driver unit.

13. A method for replacing a defective normal conducting path in a semiconductor memory with a redundant conducting path, normal conducting paths being activated by an addressing unit in response to a signal group associated with each normal conducting path, said method comprising the steps of:

identifying an associated address of said defective normal conducting path;

removing power from at least a portion of said first addressing unit, said removing power from said first addressing unit thereby preventing said first addressing unit from activating said defective normal conducting path; and when said associated address of said defective normal conducting path is identified, activating an associated redundant conducting path by applying power to at least a portion of a second addressing unit.

14. The method of claim 13 activating said associated redundant conducting path is performed further comprising the step of removing power from a portion of said second addressing unit when an address not associated with a defective normal conducting path is applied to said second addressing unit.

15. The method of claim 14 further comprising the steps of:

changing a logical state of a control signal when said second addressing unit identifies an address signal group associated with a defective normal conducting path;

applying said control signal to a power distribution unit; and switching application of power from said first addressing unit to said second addressing unit by said power distribution unit when said control signal logical state is changed.

16. The method of claim 15 wherein said removing power from at least a portion of first addressing unit includes the step of removing power from a plurality of output gates of said addressing unit; and wherein said step of removing power from a portion of said second addressing unit includes the step of removing power from at least one output gate of said second addressing unit.

17. Signal replacement apparatus for replacing transmission of a first selected activation signal of a plurality of activation signals with transmission of a second selected activation signal, said activation signals generated in response to an associated input signal groups, said replacement apparatus comprising:

a first signal generation unit responsive to plurality of input signal groups, said first signal generation unit generating least one related activation signal in response to each of said input signal groups;

a second signal generation unit responsive to at least one selected input signal group for generating at least one second selected related activation signal, said second signal generating unit generating a control signal in response to said selected input signal group; and a power distribution unit responsive to said control signal and coupled to said first and said second signal generating units, said power unit removing power from at least a portion of said first signal generation unit and applying power to at least a portion of said second signal generation unit in response to said control signal, wherein a removal of power prevents generation of activation signals from a signal generation unit.

18. The replacement apparatus of claim 17 wherein application of a non-selected input signal group to said first and said second signal generating unit removes said control signal from said power distribution unit.

19. The replacement apparatus of claim 18 wherein said first and said second signal generating units include output gate units, each output gate unit transmitting an associated activation signal, wherein said power distribution unit provides power to said output gate units.

20. The replacement apparatus of claim 19 wherein each of said output gate units includes:

a first transistor; and a second transistor coupled in series with said first transistor, wherein said activation signal to be transmitted is coupled to gate terminals of said first and said second transistor, a coupling between first terminals of said first and said second transistor being an output terminal for said gate unit, a second terminal of said second transistor unit being coupled to said power distribution unit.

21. The replacement apparatus of claim 20 wherein said power distribution unit includes at least one output buffer unit coupled to each of said first and said second signal generation units, said output buffer unit including a first and a second buffer transistor coupled in series, said output gates units coupled between first and said second transistors.

22. The replacement apparatus of claim 21 wherein said input signal groups are address signal groups, said first signal generating unit being a unit for activating normal conducting paths in a storage unit, said second signal generating unit for activating redundant conducting paths.

23. The replacement apparatus of claim 20 wherein output gate unit further includes:

a third transistor coupled in parallel with said second transistor; and an inverting amplifier, an input terminal of said inverting amplifier having said activation signal applied thereto, an output terminal of said inverting amplifier coupled to gate terminals of said first and said second gate unit transistors.

24. For use with an integrated circuit memory unit, addressing apparatus comprising:

an address decoding circuit responsive to address signals for providing activation signals to conducting paths;

a redundant address detection circuit responsive to said address signals for providing activation signals to redundant conducting paths, said redundant address detection circuit providing a control signal in response to selected address signals; and a power distribution unit for providing power to said decoder/driver unit when said control signal is not present, said power distribution unit removing power from said decoder/driver unit and applying power to said redundant decoder/driver unit when said control signal is present, an application of power determining whether said conducting paths or said redundant conducting paths have activation signals applied thereto.

25. The addressing apparatus of claim 24 wherein output circuits of said address decoding circuit and said redundant address detection circuit are gate units, wherein said power distribution unit is coupled to said gate circuits.

26. The addressing apparatus of claim 25 wherein said power distribution unit includes buffer units.

* * * * *